United States Patent
Prough

(10) Patent No.: US 6,184,691 B1
(45) Date of Patent: Feb. 6, 2001

(54) APPARATUS AND METHOD FOR TESTING COATING OF AN ELECTRICAL CONDUCTOR

(75) Inventor: David M. Prough, Leo, IN (US)

(73) Assignee: General Electric Company, Schenectady, NY (US)

(*) Notice: Under 35 U.S.C. 154(b), the term of this patent shall be extended for 0 days.

(21) Appl. No.: 09/244,655

(22) Filed: Feb. 4, 1999

(51) Int. Cl.[7] .................................................. G01R 31/12
(52) U.S. Cl. .................................... 324/551; 324/515
(58) Field of Search ..................... 324/515, 513, 324/522, 533, 539, 541, 547, 550, 551

(56) References Cited

U.S. PATENT DOCUMENTS 3,986,107 * 10/1976 Dickson et al. ...................... 324/551
4,786,876 * 11/1988 Graham ................................ 324/551
5,416,419 * 5/1995 Witt ...................................... 324/551

* cited by examiner

Primary Examiner—Safet Metjahic
Assistant Examiner—Vincent Q. Nguyen
(74) Attorney, Agent, or Firm—Nixon Peabody LLP

(57) ABSTRACT

An apparatus and method for testing a coating on a conductor, such as a dielectric coating on a wire. A high voltage source is coupled to the conductor and the coating through a primary winding of a transformer. Faults in the coating will result in a change in current in the primary winding thus inducing current in a secondary winding of the transformer. Current in the secondary winding is detected by a sensor and fault data can be compiled by known data acquisition devices.

20 Claims, 2 Drawing Sheets

US 6,184,691 B1

APPARATUS AND METHOD FOR TESTING COATING OF AN ELECTRICAL CONDUCTOR

BACKGROUND OF THE INVENTION

The invention relates to testing a coating on a conductor. In particular, the invention is a method and apparatus for detecting breakdown of a coating on a conductor, such as a wire.

Insulated wire, such as magnet wire, is produced in large commercial quantities from bare copper wire, aluminum wire, or another conductor, by applying a dielectric coating to the bare conductor. For example, a liquid resin enamel is applied to the bare conductor and cured by passing the enamel coated conductor through an oven. Plural coating layers can be applied to provide the desired insulating and/or dielectric properties of the coating. It is ideal that there be no flaws, or faults, or other breakdown in the dielectric coating. However, this is not readily achieved and thus manufacturers generally warrant that a particular wire has only a specified acceptable number, or less, of faults per unit length. To make this assurance, the manufacturer should test the wire along substantially its entire length. Various forms of wire have various insulative or dielectric coatings. The terms "insulator" and "insulative", as used herein, refer to any material or materials having a relatively low electrical conductivity with respect to an electrical conductor. The term "dielectric", as used herein, refers to any insulator which facilitates storage of energy in the form of an electric field. The term "breakdown", as used herein, refers to any defect, fault, damage, or other undesirable characteristic of the coating.

Since wire is produced in large quantities and handling these large quantities is difficult and expensive, wire is generally tested as it leaves the oven or as it leaves another processing step. Wire generally is transported at speeds up to several hundred feet per second during processing. Accordingly, it is desirable to test the coating while the wire is moving at high speed. It is known to place a high voltage across the outer surface of the coating and the conductor to test the coating for breakdown. For example, the wire can be run across a wheel coupled to the positive lead of a high voltage source (3000 VDC for example) while the conductor is coupled to ground. Current fluctuations are measured to detect coating breakdown. It is desirable to use a relatively high voltage to produce current flow for even incomplete breakdown. For example, for many wire applications, it may be necessary to detect when the resistivity of the coating is less than a threshold value which itself is quite high.

In order to accurately detect and count instances of coating breakdown, collect data relating to the counted instances, and use the collected data in reports and process quality control, it is desirable to interface the detection apparatus with modern data collection equipment, such as programmable controllers, personal computers, process controllers, and the like. Often such data collection apparatus is digital and operates at a logic level of 1 to 5 volts. Accordingly, it has been necessary to use bulky and expensive signal processing components to interface the fault detection apparatus, which operates at a high detection signal voltage, to data collection equipment, which operates a low voltage. For example, arrays of high voltage resistor networks have been used to divide the high detection signal voltage down to a level appropriate for data collection. For example, U.S. Pat. No. 3,413,541 discloses an apparatus for detecting insulation faults in magnet wire utilizing high power resistors and other components to divide a detection voltage for use in driving a recorder.

Therefore, conventional apparatus and methods for detecting dielectric breakdown require a large number of high voltage components, power resistors in particular, and thus are relatively large and expensive. Also, conventional apparatus and methods are not easily interfaced to digital data collection equipment and thus do not facilitate data collection and process control.

SUMMARY OF THE INVENTION

The invention relates to an apparatus and method for testing a coating on an electrical conductor. A first aspect of the invention is a test apparatus comprising a test voltage source, a transformer having a primary winding and a secondary winding, and a sensor. The test voltage source is connected to the primary winding and adapted for connection to the conductor to define a circuit in which current due to voltage of the test voltage source flows through the coating to the conductor through the primary winding. A change in the current through the primary winding induces current in the secondary winding. The sensor is coupled to the secondary winding to detect current through the secondary winding indicative of a breakdown in the coating of the electrical conductor.

A second aspect of the invention is a test apparatus comprising a power supply having a test voltage source and plural detection circuits each comprising a transformer and a sensor. The test voltage source is connected to a primary winding of the transformer adapted for connection to the conductor to define a circuit in which current due to voltage of the test voltage source flows through the coating to the conductor through the primary winding. A change in the current through the primary winding induces current in a secondary winding of the transformer. The sensor is coupled to the secondary winding to detect current through the secondary winding indicative of a breakdown in the coating of the electrical conductor. The detection circuits are coupled to the power supply in parallel to one another.

A third aspect of the invention is a method for testing a coating on an electrical conductor comprising the steps of providing a test voltage across the coating and the electrical conductor, directing current due to the test voltage through a primary winding of a transformer, and sensing a current induced in a secondary winding of the transformer due to fluctuations of the current in the primary winding caused by a breakdown in the coating.

BRIEF DESCRIPTION OF THE DRAWING

The invention will be described through a preferred embodiment and the attached drawing in which.

DETAILED DESCRIPTION OF THE PREFERRED EMBODIMENT

Figure 1:
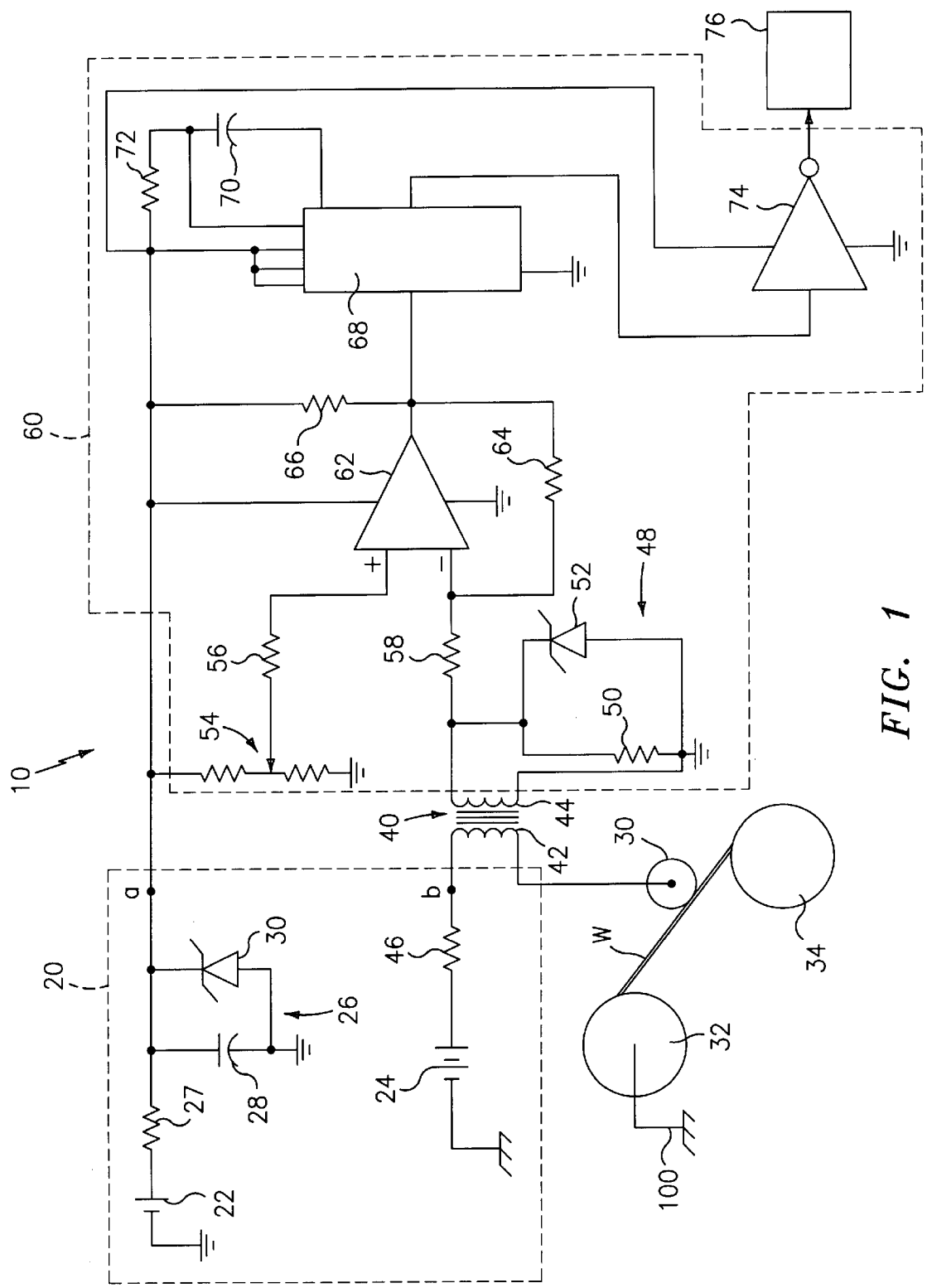
FIG. 1 is a schematic illustration of a test apparatus in accordance with a preferred embodiment of the invention.

FIG. 1 illustrates a preferred embodiment of the invention adapted to test the integrity of a dielectric coating, or other insulator, on wire, such as magnet wire. Dielectric test system 10 comprises power supply 20, transformer 40, and sensor 60, which are discussed in detail below. Power supply 20 comprises low voltage source 22 (24 VDC for example), high voltage source 24 (3000 VDC for example), power resistor 46 and regulator 26. Regulator 26 comprises a parallel circuit of zener diode 30 and capacitor 28 and serves to eliminate high frequency noise and clamp the voltage at terminal a of power supply 20 to 15 VDC, for example. Therefore, a clean low voltage DC output is present at terminal a of power supply 20. Terminal a defines a first terminal of a reference voltage source with ground being the second terminal thereof. In contrast, high voltage source 24 causes a high voltage DC output to be present at terminal b of power supply 20. Terminal b defines a first terminal of a test voltage source with ground defining the second terminal thereof. The high voltage at terminal b is used as a test voltage and the low voltage at terminal a is used to generate a reference voltage and a logic voltage in the manner described below. Power resistor 46 serves to limit current flowing through the primary winding of transformer 40, in the manner described below, and can be of any size or can be omitted, based on the particular specification of voltage source 24 and transformer 40 and other system parameters.

Transformer 40 comprises primary winding 42 and secondary winding 44 disposed on a core in a conventional manner. Transformer 40 can be a standard high voltage pulse transformer, such as but not limited to Types 3114, 3610, 3316, 1637, and 2007 manufactured by CIRCLE D CO.™ Selection of the particular characteristics of transformer 40 will be readily apparent to one of ordinary skill in the art in light of the disclosure herein. In the preferred embodiment, secondary winding 44 has about 14 turns and primary winding 42 has about 3100 turns. Note that, the part numbers specified above correspond to pulse transformers designed for output of a high voltage pulse in response to a low voltage input. In the preferred embodiment, a high voltage input is used to generate a low voltage output. Accordingly, the specified "primary" winding of these transformers are used as secondary winding 44 in the preferred embodiment and the specified "secondary" windings are used as primary winding 42 in the preferred embodiment.

Terminal b of power supply 20 is coupled to one terminal of primary winding 42. The other terminal of primary winding 42 is coupled to contact wheel 36 serving to make electrical contact between primary winding 42 and a coating on wire W. Contact wheel 36 can include any necessary insulating members and rotational couplings as is well known. Alternatively, a brush or any other electrode or the like can be used to electrically couple primary winding 42 to the coating of wire W. Wire W will be passed along contact wheel 36, in the manner described below, during a testing operation.

The secondary winding 44 is coupled to sensor 60. In particular, secondary winding 44 is coupled to the inverting input of comparator 62 which can be a standard operational amplifier configured for non-inverting gain. Feedback resistor 64, resistor 58, and resistor 56 are selected to provide the desired gain in the operational amplifier in a known manner. Regulator 48 comprises a parallel connection of resistor 50 and zener diode 52 and is coupled in parallel to secondary winding 44 to define a circuit. Regulator 48 clips and eliminates noise in current flowing into the inverting input of comparator 62.

Terminal a of power supply 20 is connected to one terminal of tapped resistor 54. The other terminal of tapped resistor 54 is connected to ground. The tap of tapped resistor 54 is coupled to the non-inverting input of comparator 62 through resistor 56. Resistor 56 serves to limit current supplied to the non inverting input of comparator 62. Tapped resistor 54 is adjusted to provide the desired reference voltage to comparator 62 based on the design parameters of system 10, the type of conductor and coating being tested, the threshold for detecting breakdown in the coating, and other practical considerations which will be apparent to one of ordinary skill in the art in light of the disclosure herein.

The output of comparator 62 is coupled to terminal a of power supply 20 through pull up resistor 66 to stabilize the output of comparator 62, at 15 V for example. As noted above, the output of comparator 62 is also fed back to the inverting input through resistor 64. A power terminal of comparator 62 is coupled to terminal a of power supply 20 and a ground terminal of comparator 62 is grounded as is well known.

The output of comparator 62 is also coupled to an input of monostable multivibrator 68 which serves as a "one shot" device. In other words, each input into monostable multivibrator 68 will result in a single pulsed output of a selected period. The period of the pulsed output is selected, in a known manner, by coupling resistor 72 and capacitor 70 in the manner shown and selecting the value of resistor 72 and capacitor 70. However, the period can be selected through any other adjustment mechanism, such as DIP switches, a pot, or the like, depending on the particular one shot device used. Monostable multivibrator 68 is coupled to terminal a of power supply 20 and to ground at appropriate terminals to provide power. The output of monostable multivibrator 68 is coupled to the input/output (I/O) interface of programmable controller 76 through invertor 74. Invertor 74 can be omitted depending on the I/O interface specifications.

Wire W can be tested as it leaves an enameling oven or at any other time or location. In the preferred embodiment, wire W is tested as it is unreeled from supply reel 32 onto take-up reel 34. Contact wheel 36 is insulated from ground and rotates while a conductive surface thereof is in contact with wire W as wire W passes by contact wheel 36. There can be more than one contact wheel to insure good contact with the entire periphery of wire W if necessary. The conductor of wire W is grounded in a known manner, as schematically illustrated by connection 100, i.e. is connected to the second terminal of power source 24. Accordingly, when a portion of wire W having a fault or defect in the coating thereof comes into contact with contact wheel 36, current will flow from terminal b of power supply 20 to ground through primary winding 42 of transformer 40. Of course, the coating inherently has some value of conductivity which varies along the length thereof and thus a small amount of current of varying magnitude may flow through primary winding 42 at any time. However, the reference voltage supplied to the non-inverting input of comparator 62 is adjusted to allow sensor 60 to ignore current flow variation due to variance between acceptable levels of conductivity of the coating.

In operation, tapped resistor 54 is set to provide an appropriate reference voltage to the non-inverting input of comparator 62. For example if, based on the parameters of system 10, it is determined that a voltage of 1.5 VDC at the inverting input of comparator 62 represents the highest acceptable conductivity of the coating, tapped resistor 54 is set to provide 1.5 VDC to the non-inverting input of comparator 62 for comparison to the inverting input of comparator 62. This serves to establish an initial steady state of comparator 62. When a portion of wire W having a breakdown in the coating thereof passes contact wheel 36, a larger current will flow from terminal b of power supply 20 to ground through primary winding 42 of transformer 40 due to the increased conductivity of the defective coating. This change in current through primary winding 42 will induce a current in the circuit comprising secondary winding 44 and regulator 48. A small current will thus flow through resistor 58 and there will be a voltage change at the inverting input of comparator 62. If the instantaneous voltage at the inverting input is greater than the reference voltage at the non-inverting input, a current will flow at the output of comparator 62 to balance this voltage difference in a known manner.

The output of comparator 62 is coupled to an input of monostable multivibrator 68. Therefore the output of comparator 62 causes a pulse of a desired period to be output from monostable multivibrator 68 to programmable controller 76 which detects a breakdown in the coating of wire W. Programmable controller 76 can be programmed to collect breakdown pulses as data versus position along the wire. Any type of statistical sampling or manipulation can be accomplished to present desired reports and/or to control the wire manufacturing process to minimize and document faults.

Table 1 below provides parameters for the various electrical and electronic elements of the preferred embodiment which applicant has found to produce desirable results. Of course these elements and parameters can be changed or omitted based on the particular application.

TABLE 1

| ELEMENT | DESCRIPTION |
|---|---|
| Low Voltage Source 22 | 24 VDC |
| High Voltage Source 24 | 3000 VDC |
| Capacitor 28 | 100 $\mu f$; 35 VDC |
| Zenier Diode 30 | 15 V, 5 Watts |
| Transformer 40 | Circle D ™ part no. 3114-12A2, 3150 primary turns, 14½ secondary turns, peak primary current 60A. |
| Resistor 46 | 50MΩ Victoreen SLIM-MOX 102 1% |
| Transistor 50 | 1.5MΩ |
| Zenier Diode 52 | 15 V, 0.5 Watts |
| Trim Pot 54 | 50kΩ |
| Resistor 56 | 1kΩ |
| Resistor 58 | 10kΩ |
| Comparator 62 | National Semiconductor ™ ½ LM 393 |
| Resistor 64 | 10MΩ |
| Resistor 66 | 4.7KΩ |
| Monostable Vibrator 68 | Motorola ™ ½ 4528 |
| Capacitor 70 | 0.1 $\mu f$ |
| Resistor 72 | 10KΩ |
| Inverter 74 | Motorola ™ 4049 |

Figure 2:
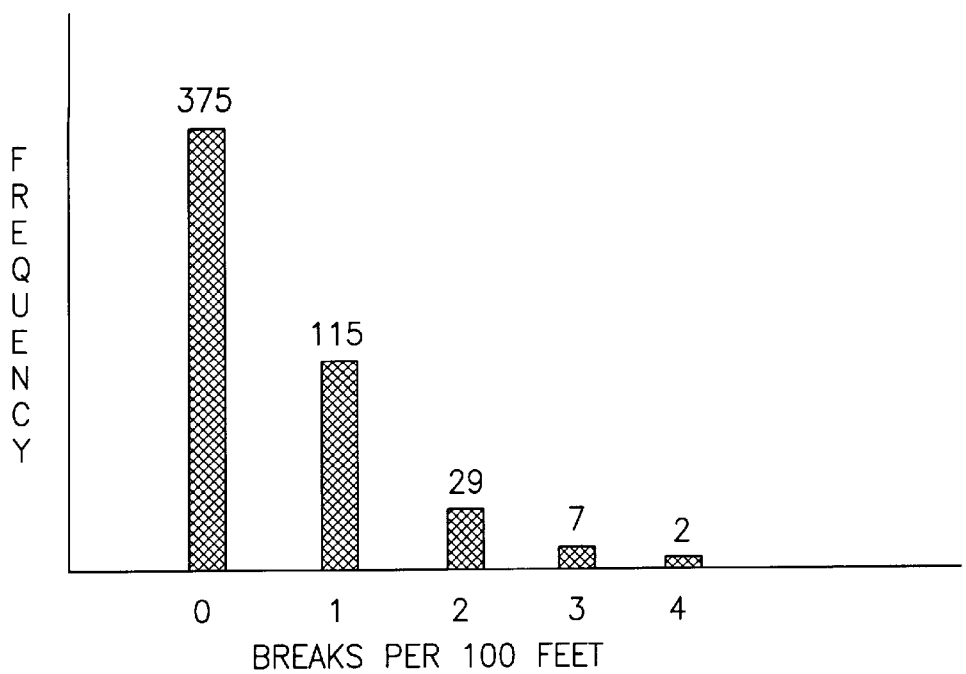
FIG. 2 is a graph illustrating the poissonian distribution of dielectric breakdown of wire detected using an apparatus in accordance with the invention.

FIG. 2 is a graph illustrating the Poissonian distribution of breakdown detected in approximately 10 miles of wire using the preferred embodiment of the invention. As each 100 feet of wire passed the detection apparatus, the number of breakdown occurrences in that 100 feet of wire was detected and recorded. The x axis of the graph represents the breakdown per 100 feet and the y axis represents the frequency that the value was detected. For example, FIG. 2 shows that 1 breakdown per 100 feet was detected 115 times over the length of wire. It can be seen that, as the breakdown per 100 feet of wire increases, the frequency of detection decreases exponentially and approaches zero. The data illustrated in FIG. 2 was collected as the wire left a wire mill enamel oven. The mean of breakdowns equals to 0.382 per 100 feet of wire. These results are indicative of high quality wire.

Figure 3:
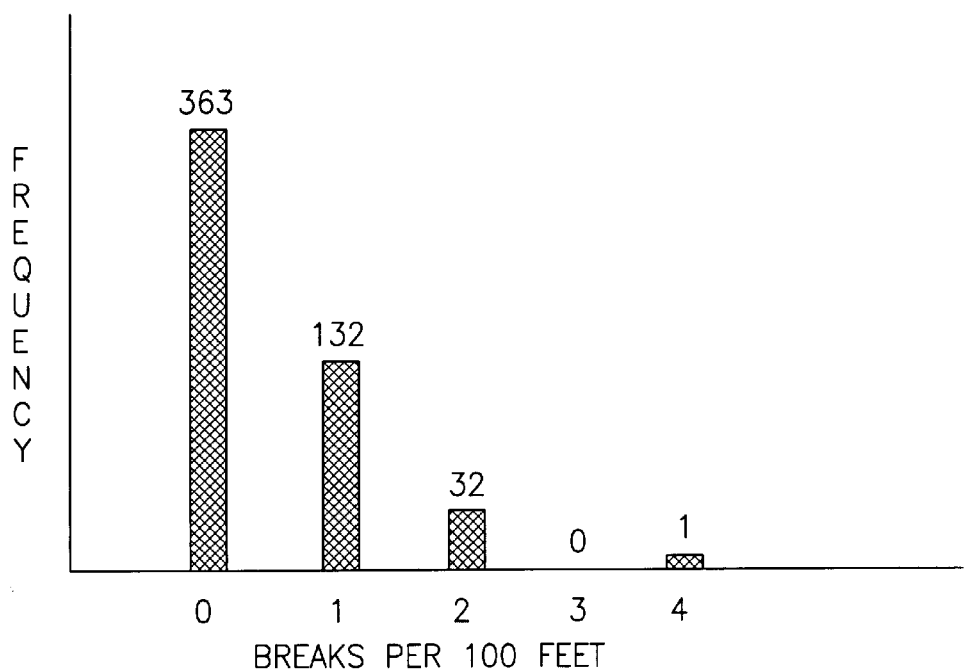
FIG. 3 is a graph illustrating the poissonian distribution of dielectric breakdown of wire detected using conventional apparatus with resistor/divider networks.

FIG. 3 is a graph illustrating the Poissonian distribution of breakdowns detected in approximately 10 miles of wire with a conventional apparatus having a resistor/divider network for reducing the detection voltage. Similar to FIG. 2, the x axis of the graph represents the breakdowns per 100 feet and the y axis represents the frequency that the value was detected. For example, FIG. 3 shows that 1 breakdown per 100 feet was detected 132 times over the length of wire. It can be seen that the distribution of the data illustrated in FIG. 3 is similar to that of FIG. 2. The mean of breakdowns equals to 0.379 per 100 feet of wire. The correlation between the data of FIG. 2 and the data of FIG. 3 is –0.065. The data illustrated in FIG. 3 was collected as the wire left a wire mill enamel oven in a line parallel to that used for the data of FIG. 2. Therefore, it is expected that the results should be similar. All testing was conducted at speeds under 200 feet per minute.

It can be seen that the invention provides accurate detection of faults in a conductor without the need for a large amount of high powered electrical components. The invention can be easily interfaced to process control and data collection systems. The use of a transformer to reduce the detection voltage eliminates the need for high power resistor/divider networks and thus permits the test apparatus to be integrated into a small package. For example, the test apparatus can be mounted on a single circuit card in an instrument case, chassis, or the like. The sensor of the preferred embodiment includes a comparator and other signal processing/conditioning circuitry. However, any type of sensor can be used to detect, directly or indirectly, current induced in the secondary winding of the transformer. The signal processing circuitry can be modified or omitted based on the type of data collection or fault indication used. For example, a current meter, recorder, stylus pen, or simple pilot light can be used as the sensor to indicate coating breakdown. The power supply and other components can be configured based on the particular application. For example, depending on the type of sensor used, the low voltage power source may be unnecessary. A single power supply can be used in connection with plural test circuits of transformers and sensors coupled in parallel to one another to test parallel lines of wire or the like simultaneously. The test voltage source can be directly or indirectly electrically coupled to the conductor to cause current flow due to a fault. Also, the various regulators and other signal conditioning components can be modified or omitted. The primary winding of the transformer can be coupled to the conductor, coating, and power source in any manner to cause current due to a fault to the flow through the primary winding. The invention can be used to test magnet wire, other wire, or any other conductor having a coating.

The invention has been described through a preferred embodiment. However various modifications can be made without departing from the scope of the invention as defined by the appended claims.

What is claimed is:

1. An apparatus for testing a coating on an electrical conductor comprising:
   a test voltage source having two terminals;
   a transformer having a primary winding and a secondary winding, said test voltage source being coupled to said primary winding, and adapted for connection to said conductor to define a circuit in which current due to voltage of said test voltage source flowing through said coating to said conductor flows through said primary winding of said transformer; and
   a sensor coupled to said secondary winding to detect current through said secondary winding induced by a change in current through said primary winding to indicate a breakdown in the coating of the electrical conductor.

2. An apparatus as recited in claim 1 wherein one of said terminals of said test voltage source is coupled to a first terminal of said primary winding, a second terminal of said primary winding is adapted for connection to the coating, and the other of said terminals of said test voltage source is coupled to said conductor.

3. An apparatus as recited in claim 2, further comprising an electrically conductive contact wheel adapted to be in rotating contact with the electrical insulator as the elongate wire passes said contact wheel, said second terminal of primary winding being connected to said contact wheel.

4. An apparatus as recited in claim 1, further comprising a reference voltage source coupled to said sensor, said sensor comprises a comparator for comparing a reference voltage generated by said reference voltage source with a voltage due to current flowing through said secondary winding of said transformer.

5. An apparatus as recited in claim 4, further comprising a one-shot device coupled to an output of said comparator to thereby provide a pulsed output of a predetermined period for each breakdown in the coating.

6. An apparatus as recited in claim 1, wherein the electrical conductor is elongate wire and the coating is an electrical insulator disposed around the wire.

7. An apparatus as recited in claim 6, wherein the electrical insulator is a dielectric material.

8. An apparatus as recited in claim 7, further comprising a reference voltage source coupled to said sensor, said sensor comprises a comparator for comparing a reference voltage generated by said reference voltage source with a voltage due to current flowing through said secondary winding of said transformer.

9. An apparatus as recited in claim 6, further comprising a reference voltage source coupled to said sensor, said sensor comprises a comparator for comparing a reference voltage generated by said reference voltage source with a voltage due to current flowing through said secondary winding of said transformer.

10. An apparatus for testing coating on plural electrical conductors comprising:

a power supply having a test voltage source having two terminals;

plural detection circuits each comprising a transformer having a primary winding and a secondary winding, said test voltage source being coupled to said primary winding and adapted for connection to said conductor to define a circuit in which current due to voltage of said test voltage source flowing through said coating to said conductor flows through said primary winding of said transformer, said detection circuit further comprising a sensor coupled to said secondary winding to detect current through said secondary winding induced by a change in current through said primary winding to indicate a breakdown in the coating of the electrical conductor;

wherein said detection circuits are coupled to said power supply in parallel to one another.

11. An apparatus as recited in claim 10 wherein one of said terminals of said test voltage source is coupled to a first terminal of each of said primary windings, a second terminal of each of said primary windings is adapted for connection to the coating of an associated conductor and the other of said terminals of said test voltage source is coupled to said associated conductor.

12. An apparatus as recited in claim 10 further comprising an electrically conductive contact wheel associated with each of said detection circuits and adapted to be in rotating contact with the coating of an associated conductor as the conductor passes said contact wheel, a corresponding one of said primary windings being connected respectively to each of said contact wheels.

13. An apparatus as recited in claim 10, wherein each of the electrical conductors is elongate wire and the coating is an electrical insulator disposed around the wire.

14. An apparatus as recited in claim 13, wherein the electrical insulator is a dielectric material.

15. An apparatus as recited in claim 10, wherein said power supply further comprises a reference voltage source coupled to said sensors, each of said sensors comprising a comparator for comparing a reference voltage generated by said reference voltage source with a voltage due to current flowing through a corresponding one of said secondary windings of said transformers.

16. An apparatus as recited in claim 15, wherein each of said sensors further comprises a one-shot device coupled to an output of said comparator to thereby provide a pulsed output of a predetermined period for each breakdown in the coating.

17. A method for testing a coating on an electrical conductor comprising the steps of:

providing a test voltage across the coating and the electrical conductor;

directing current due to the test voltage through a primary winding of a transformer; and sensing a current induced in a secondary winding of the transformer due to fluctuations of the current in the primary winding caused by breakdown in the coating.

18. A method as recited in claim 17, wherein said sensing step comprises comparing a reference voltage with a voltage due to current flowing through said secondary winding of said transformer.

19. A method as recited in claim 17, wherein the electrical conductor is elongate wire and the coating is an electrical insulator disposed around the wire.

20. A method as recited in claim 19, wherein the electrical insulator is a dielectric material.

\* \* \* \* \*